(12) United States Patent
Nakano et al.

(10) Patent No.: US 9,117,657 B2
(45) Date of Patent: Aug. 25, 2015

(54) METHOD FOR FILLING RECESSES USING PRE-TREATMENT WITH HYDROCARBON-CONTAINING GAS

(71) Applicant: ASM IP Holding B.V., Almere (NL)

(72) Inventors: Akinori Nakano, Tokyo (JP); Shintaro Ueda, Tama (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 13/912,666

(22) Filed: Jun. 7, 2013

(65) Prior Publication Data

US 2014/0363983 A1 Dec. 11, 2014

(51) Int. Cl.
*H01L 21/02* (2006.01)

(52) U.S. Cl.
CPC ...... *H01L 21/02112* (2013.01); *H01L 21/0201* (2013.01)

(58) Field of Classification Search
None
See application file for complete search history.

(56) References Cited

U.S. PATENT DOCUMENTS

| | | | |
|---|---|---|---|
| 7,541,297 B2 | 6/2009 | Mallick | |
| 7,582,555 B1 | 9/2009 | Lang | |
| 7,629,277 B2 | 12/2009 | Bhatnagar | |
| 7,888,233 B1 | 2/2011 | Gauri | |
| 7,915,139 B1 | 3/2011 | Lang | |
| 8,187,951 B1 | 5/2012 | Wang | |
| 2001/0049202 A1* | 12/2001 | Maeda et al. | 438/778 |
| 2007/0281496 A1* | 12/2007 | Ingle et al. | 438/778 |
| 2010/0221452 A1* | 9/2010 | Kang | 427/577 |

OTHER PUBLICATIONS

S. Nogueira, et al. "Production of Highly Hydrophobic Films Using Low Frequency and High Density Plasma" Revista Brasileira de Aplicacoes de Vacuo, 25(1) (2006): 45-53.*
C.J. Drummond, et al. "Hydrophobic radiofrequency plasma-deposited polymer films: dielectric properties and surface forces." Colloids and Surfaces A 129-130 (1997): 117-129.*
S. Kurosawa, et. al., Synthesis and characterization of plasma-polymerized hexamethyldisiloxane films, Thin Solid Films 506-507 (2006) 176-179.*

* cited by examiner

*Primary Examiner* — Charles Garber
*Assistant Examiner* — Alia Sabur
(74) *Attorney, Agent, or Firm* — Snell & Wilmer LLP

(57) ABSTRACT

A method for filling recesses of a substrate with an insulation film includes: (i) exposing surfaces of the recesses of the substrate to a pre-deposition gas in a reactive state in a reaction space to treat the surfaces with reactive hydrocarbons generated from the pre-deposition gas without filling the recesses; and (ii) depositing a flowable insulation film using a process gas other than the pre-deposition gas on a surface of the substrate to fill the recesses treated in step (i) therewith by plasma reaction. The pre-deposition gas has at least one hydrocarbon unit in its molecule.

17 Claims, 4 Drawing Sheets

METHOD FOR FILLING RECESSES USING PRE-TREATMENT WITH HYDROCARBON-CONTAINING GAS

BACKGROUND OF THE INVENTION

1. Field of the Invention

The present invention generally relates to interlayer-insulating technology for semiconductor integrated circuits, and particularly relates to so-called flowable CVD methods for filling patterned recesses with an interlayer-insulating film where the distance between wiring lines is narrow.

2. Description of the Related Art

In recent years, semiconductor devices have made impressive progress and achieved high integration, high speed, and high capacity, which allow for micro-fabrication of wiring. As micro-fabrication of wiring progresses, signal delay and increase of power consumption becomes problematic due to the increase of line capacity of wiring in the multilayer wiring structure. To solve this problem and to reduce the line capacity of wiring, so-called low-k film whose dielectric constant is low has been developed as an insulation film between wires, in addition, as a wiring material, copper is mainly used fin the purpose of reducing resistivity of the wiring material itself and improving signal delay. A well-known method for forming multilayer wiring using a low-k film and copper is a damascene method.

In the damascene method, multilayer wiring is completed by first forming a low-k film, then forming grooves (trenches) or connecting holes (via holes) by lithographic exposure and etching, and finally embedding copper therein. This damascene method has been playing a leading role in the field of film multilayer wiring technology. However, if micro-fabrication of wiring continues, copper used as a wiring material will increase its resistivity due to the width of wiring being too narrow, and as a result, copper loses its advantage. Since copper diffuses easily in a low-k film, if it is used as wiring material, it is required that additional complicated steps such as those for stopping the diffusion be taken. Thus, in place of copper, tungsten starts to re-garner attention, which has been used as a metal material since early times, because tungsten does not require complicated steps, and therefore it is possible to simplify the wiring steps and reduce the manufacturing cost.

By using tungsten as a wiring material, because it is relatively easier to etch as compared with copper, a metal wiring can first be formed without using a damascene method, and an interlayer insulating film can then be formed between the formed metal wirings. However, with conventional CVD methods, as the space between wires is extremely narrow, the space is difficult to be filled with a low-k film, and voids and the like are formed in the low-k film. Therefore, to solve this problem, a flowable CVD method has been developed.

In real device-wiring, there are some places where wiring intervals are wide and some other places where wiring intervals are narrow, and also places where both are mixed. Because of this unevenness, there is a challenge in filling all places until all grooves are filled so as to provide a flat surface by a flowable CVD method. Filling can be achieved by simply depositing a thick film according to the height from the top of the wiring, but if it is too thick, etching is required to etch unnecessary or excess film to flatten the surface of the deposited film. Also, if the film is too thick, a problem such as film-cracking occurs.

Conventionally, to improve filling properties, a method using a catalyst is known, as reported in, e.g., U.S. Pat. No. 8,187,951 and U.S. Pat. No. 7,629,227. However, with this method, a catalyst itself cannot evaporate and is left in a material, and therefore, this flowable CVD film-forming method does not significantly improve the filling properties. In addition, a method of causing an insulation film-forming material, alcohol, water, and the like to flow simultaneously during the film-forming process is known, as reported in, e.g., U.S. Pat. No. 7,915,139, U.S. Pat. No. 7,582,555, U.S. Pat. No. 7,888,233. However, with this method, there are problems such as generation of voids formed in the film after the film-forming process, and an extremely large amount of silanol contained in the material causing corrosion of metal and causing imperfect wiring.

As a general pre-treatment, a plasma treatment using a plasma of an inactive gas such as He and Ar, and a reduction treatment using a hydrogen plasma are known, but those methods have not improved the flatness of the film surfaces.

In the above and elsewhere in this disclosure, any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In some embodiments of the present invention, provided is flowable CVD technology to fill recesses of a substrate with flowable film at a high flatness even when line spaces are small or regardless of the line spaces, and even when the recesses are shallow. Some embodiments provides a pre-deposition step performed, prior to a deposition step, to subject surfaces of recesses of a substrate to hydrophobic treatment using a pre-deposition gas or precursor which may be a hydrocarbon gas or a gas having at least one hydrocarbon unit in its molecule, such as a silazane compound having at least one hydrocarbon unit. The surfaces of the recesses to be treated include top surfaces, side walls, and bottom surfaces of the recesses, and top and side surfaces of wiring parts placed at bottoms of the recesses. The pre-deposition gas can become reactive or excited by applying any suitable energy such as heat, UV light, IR light, or plasma to the gas, or if the pre-deposition gas is highly reactive with terminal groups on a surface, the pre-deposition gas can become reactive simply by flowing over the surface under a vacuum. In some embodiments, the pre-deposition step can be conducted in-situ, i.e., in a reactor, immediately followed by a deposition step in the same reactor. In some embodiments, the hydrophobicity of the treated surfaces are such that the water contact angle of the treated surfaces at room temperature can increase to more than about 80°, for example. In some embodiments, by the pre-deposition step, a flatness (a ratio of the lowest thickness in a recess to the height of the recess) of the resultant surface of the substrate after filling the recesses can be improved from about 20% (without the pre-deposition step) to about 75%, for example. Further, in some embodiments, the pre-deposition step can be applied to any suitable flowable film, regardless of the type of flowable film. Also, in some embodiments, the pre-deposition step does not affect the properties of a resultant insulation film converted from a flowable film. As described above, the pre-deposition step can bring about the surprising effects and is a highly effective method to form flattened surfaces of filled recesses.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
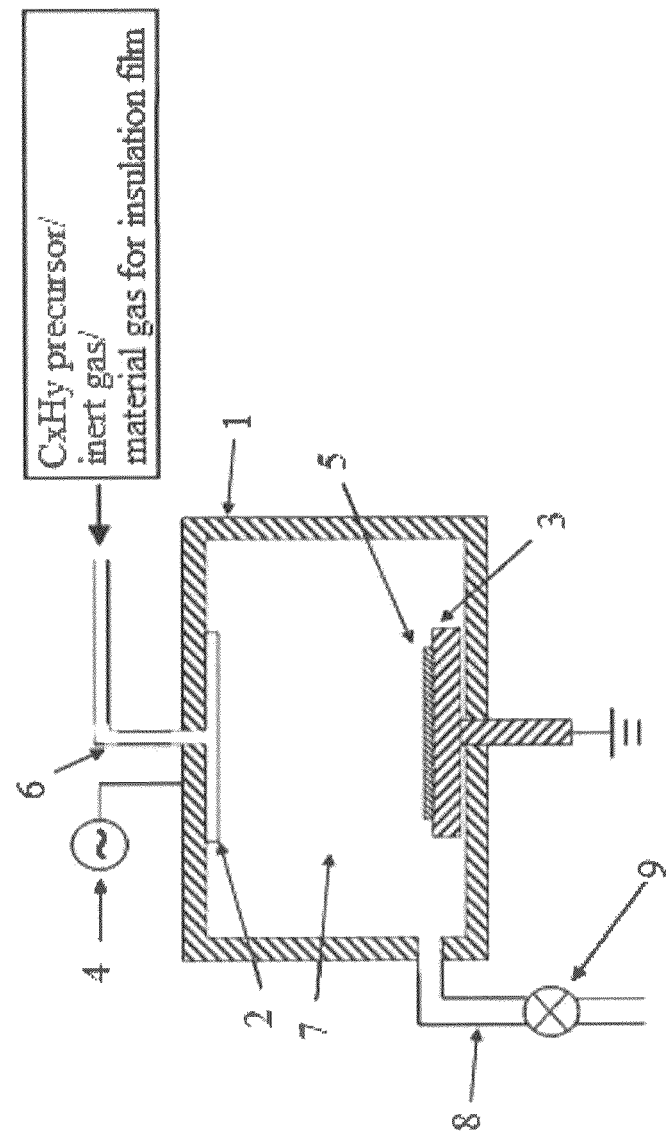
FIG. 1 is a schematic view of a plasma CVD apparatus usable in some embodiments of the present invention.

In this disclosure, "gas" may include vaporized solid and/or liquid and may be constituted by a single gas or a mixture of gases. Likewise, an article "a" or "an" refers to a species or a genus including multiple species. In this disclosure, a pre-deposition gas introduced to a reaction chamber through a showerhead may be comprised of, consist essentially of, or consist of a hydrocarbon-containing precursor and an inert gas such as a rare gas, or a hydrocarbon-containing gas only. The precursor and the additive gas can be introduced as a mixed gas or separately to a reaction space. The precursor can be introduced with a carrier gas such as a rare gas. A gas other than the pre-deposition gas, i.e., a gas introduced without passing through the showerhead, may be used for, e.g., sealing the reaction space, which includes a seal gas such as a rare gas. In some embodiments, "flowable film" refers to a non-conformal film which is flowable downward by gravity while being deposited on a recess. In some embodiments, "film" refers to a layer continuously extending along a surface substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above, some embodiments of the present invention provide flowable CVD technology to fill recesses of a substrate with flowable film at a high flatness. In some embodiments, a method for filling recesses of a substrate with an insulation film, comprises: (i) exposing surfaces of the recesses of the substrate to a pre-deposition gas in a reactive state in a reaction space to treat the surfaces with reactive hydrocarbon-containing species generated from the pre-deposition gas without filling the recesses, said pre-deposition gas having at least one hydrocarbon unit in its molecule; and (ii) depositing a flowable insulation film using a process gas other than the pre-deposition gas on a surface of the substrate to fill the recesses treated in step (i) therewith by plasma reaction. In this disclosure, the "recess" refers to any recess formed on a substrate to be filled with a dielectric material, including, but not limited to, trenches, via holes, recesses formed between wires, and other grooves or patterned recess formed on a surface of a substrate.

Typically, the surfaces of the recesses treated in step (i) are hydrophobic. In some embodiments, the hydrophobic surfaces of the recesses have a water contact angle (at room temperature) of more than about 80°, e.g., at least about 85°, about 90°, or about 95°. Due to the hydrophobic surfaces, a flowable material which deposits thereon is easily movable along the hydrophobic surfaces by gravity, thereby inhibiting accumulation of the flowable material on top surfaces of the recesses and promoting flow toward recesses of the recesses.

In some embodiments, step (i) continues until a film having a thickness of less than about 1.5 nm is formed on the surfaces, and thereafter is stopped. The film covers the surfaces of recesses and wiring parts placed therein and serves as a coating which may be referred to as "pre-deposition coating". In some embodiments, the thickness of the pre-deposition coating is at least about 0.5 nm, e.g., in a range of about 1.0 nm to about 3 nm (when the duration of the pre-deposition step is significantly extended, the thickness may reach about 3 nm), depending on the size of recesses, etc. In some embodiments where a silazane compound is used as a pre-deposition gas, since the silazane compound is reactive with —OH groups present on the surface, by causing the silazane compound (which is not in an excited state) to flow over the surface under a vacuum (at a temperature of about −10° C. to about 50° C.), —CH$_3$ units replaces —OH group and are attached to the surface, thereby rendering the surface hydrophobic. In the above, in some embodiments, the thickness of the coating may be less than about 0.5 nm or the coating may not even form a film but may be constituted by —CH$_3$ terminals.

In some embodiments, the hydrocarbon units (CxHy; x and y are integers wherein x may be 1 to 10, or 2 to 6) included in the pre-deposition gas are selected from the group consisting of —CH$_2$, —CH$_3$, —C$_2$H$_4$, —C$_2$H$_5$, —C$_3$H$_6$, and —C$_3$H$_7$, and preferably the hydrocarbon units have C—C bonds. In some embodiments, the hydrocarbon units are aliphatic or aromatic straight-chain or branched saturated hydrocarbon groups such as —(CH$_2$)$_5$CH$_3$ or aliphatic or aromatic straight-chain or branched unsaturated hydrocarbon groups such as —C$_2$H or —C$_6$H$_5$. The materials including the hydrocarbon units may have a boiling point of 35 to 220° C., and if the material is liquid prior to introduction into the reaction chamber, the material is vaporized upstream of the reaction chamber and then introduced into the reaction chamber. In some embodiments, the pre-deposition gas is a hydrocarbon gas containing no silicon. For example, branched or straight-chained alphatic hydrocarbons or aromatic hydrocarbons can be used. Alternatively, the pre-deposition gas is a compound having a Si—N bond, which includes amonosilane and silazane compounds. Preferably, the pre-deposition gas is a gas capable of generating —CH$_3$ groups when being excited by a plasma or other energy, which —CH$_3$ groups can effectively render the surfaces hydrophobic.

The pre-deposition gas may be constituted by one or more compounds selected from the group consisting of methane, ethane, propane, ethylene, acetylene, propylene, methylacetylene, cyclopropane, n-butane, isobutane, 1-butene, cis-2-butene, trans-2-butene, isobutene, ethylacetylene, 1,3-butadiene, n-pentane, isopentane, neopentane, cyclopentane, n-hexane, cyclohexane, 2-methylpentane, 3-methylpentane, 2,2-dimethylbutane 2,3-dimethylbutane, n-heptane, 2-methylhexane, 3-methylhexane, 2,2-dimethylpentane, 2,3-dimethylpentane, 2,4-dimethylpentane, 3,3-dimethylpentane, 3-ethylpentane, 2,2,3-trimethylbutane, n-octane, 3,4-dimethylhexane, 2-methylheptane, 3-methylheptane, 4-methylheptane, 3-ethylhexane, 2,2-dimethylhexane, 2,3-dimethylhexane, 2,4-dimethylhexane, 2,5-dimethylhexane, 3,3-dimethylhexane, 3,4-dimethylhexane, 2-methyl-3-ethylpentane, 3-methyl-3-ethylpentane, 2,2,3-trimethylpentane, 2,2,4-trimethylpentane, 2,2,3,3-tetramethylbutane, n-decane, cyclodecane, hexadecane, n-dodecane, cyclododecane, ethylcyclododecane, benzene, toluene, ethylbenzene, 1,3-dimethylbenzene, 1,3,5-trimethylbenzene, methylaminosilane, dimethylaminosilane, methyl(methylamino)silane, N-(trimethylsilyl)dimethylamine, tris(dimethylamino)silane, diisopropylmethyl(methylamino)silane, methylbis(dimethylamino)silane, methyltris(dimethylamino)silane, and hexamethyldisilazane.

In some embodiments, during step (i), no oxidizing gas or halide gas is introduced to the reaction space. That is, in order to effectively render hydrophobic the surfaces of recesses and wiring parts placed therein, the pre-deposition gas may not be used together with an oxidizing gas or halide gas such as O$_2$, CO, CO$_2$, NO, NO$_2$, N$_2$O, Cl$_2$, HF, NF$_3$, ClF$_3$, CCl$_4$, CF$_4$, C$_2$F$_6$, and C$_3$F$_8$.

In some embodiments, all the gas used in step (i) consists of the pre-deposition gas alone or a mixture of the pre-deposition gas and an inert gas. The inert gas may be used for stability and may be selected from a rare gas such as He, Ar, Xe, Kr, and/or Ne, and/or another inert gas such as N$_2$ and/or H$_2$. The flow rate of the pre-deposition gas may be in a range of about 10 sccm to about 10,000 sccm, typically about 10 sccm to about 5,000 sccm. The flow rate of the rare gas may be in a range of about 10 sccm to about 10,000 sccm, typically about 10 sccm to about 5000 sccm. The flow rate of the other inert gas may be in a range of about 10 sccm to about 10,000 sccm, typically about 10 sccm to about 5000 sccm.

In some embodiments, in step (i), the pre-deposition gas is excited by applying RF power to the reaction space to which the pre-deposition gas is introduced. In some embodiments, the RF power is applied at a power of about 0.55 W/cm$^2$ or less, preferably about 0.35 W/cm$^2$ or less, per area of the substrate. Typically, the lowest RF power which is required to conduct the pre-deposition step may be about 0.07 W/cm$^2$ (about 50 W for a 300-nm wafer). If RF power is too high, generated —CH$_3$ groups for rendering the surfaces hydrophobic may be broken down, interfering with hydrophobic changes, and further abnormal discharge such as arcing may occur. The frequency of RF power may be in a range of 400 KHz to 60 MHz. In some embodiments, the temperature and the pressure for the RF power application may be about −10° C. to about 50° C., preferably about 0° C. to about 30° C., and about 100 Pa to about 1200 Pa, preferably about 500 Pa to about 1200 Pa, respectively. In some embodiments, a remote plasma unit may be used for generating excited pre-deposition gas and introducing it to a reaction chamber.

Alternatively, UV light irradiation and heating can be used to excite the pre-deposition gas in a reaction chamber. For UV light irradiation, Excimer UV light having a wavelength of about 126 nm to about 308 nm with a lamp power of about 50 W/cm to about 200 W/cm, and high pressure mercury UV light having a wavelength of about 250 nm to about 600 nm with a lamp power of about 50 W/cm to 200 W/cm can be used at a temperature of about 0° C. to about 300° C. For heating (without UV light irradiation or other energy application), the temperature may be controlled at about 0° C. to about 400° C.

In some embodiments, step (i) is conducted for a period of no less than about 10 seconds but no more than about 10 minutes, preferably about 30 seconds but no more than 300 seconds, depending on the type of energy used for exciting the pre-deposition gas, the type of the pre-deposition gas, etc.

Typically, the surfaces of the recesses prior to step (i) are hydrophilic. The surfaces of the recesses prior to step (i) may have a water contact angle of less than about 30° or less than about 20° or less. In some embodiments, the surfaces of the recesses are constituted by silicon, GaAS, or quartz glass. In some embodiments, the surfaces are further constituted by a wiring material which may be made of tungsten, aluminum, and/or copper, and the surfaces of these wiring materials also can be rendered hydrophobic by the pre-deposition step.

In some embodiments, step (ii) is conducted at a temperature of about 50° C. or lower (e.g., −10° to 50°) as the temperature of the substrate, depending on the flowable properties of the flowable insulation film. That is, the temperature of the deposition step (step (ii)) may be adjusted so as to keep the flowable insulation material flowable in recesses. When steps (i) and (ii) are conducted continuously, the temperature of the pre-deposition step (step (i)) may be substantially the same as that of the deposition step (step (ii)) for efficient operation. In the above, "continuously" refers to without breaking a vacuum, without interruption as a timeline, without changing treatment conditions, immediately thereafter, as a next step, or without a discrete physical or chemical boundary between two structures in some embodiments. In some embodiments, step (i) and step (ii) may be conducted at different temperatures (e.g., these steps are conducted in different chambers), wherein the temperature of step (i) may be substantially higher than that of step (ii) since the flowability required for step (ii) is not required for step (i).

In some embodiments, the flowable insulation film is a low-k film such as that constituted by silicon oxide. Such a film may be formed using alkoxide and alkylamine material, for example. In some embodiments, step (ii) is conducted by plasma-enhanced CVD.

Additionally, the pre-deposition step can increase the growth rate of an insulation film by at least about 5%. Although the reasons for such an increase is unknown, the increase is significant.

An apparatus that can be used in some embodiments of the present invention is explained below. This apparatus can be used for both the pre-deposition step and the deposition step, and these two steps can be conducted continuously.

FIG. 1 is a schematic view of a plasma CVD apparatus usable in some embodiments of the present invention. The plasma CVD device includes a reaction chamber 1, a gas inlet port 6, a cooling susceptor 3 (serving as a lower electrode) provided with an embedded temperature controller which can be a coil in which a coolant or heating medium flows in a channel to control the temperature of the susceptor 3 and an overlying semiconductor substrate 5. A showerhead 2 (serving as an upper electrode) may be disposed immediately under the gas inlet port. The showerhead 2 has a number of fine openings at its bottom face and can inject reaction gas to the semiconductor substrate 5 therefrom. There is an exhaust port 8 provided with a pressure control valve 9 at the bottom of the reaction chamber 1. This exhaust port 8 is connected to an outer vacuum pump (not shown) so that the inside of the reaction chamber 1 can be evacuated. The susceptor 3 is placed in parallel with and facing the showerhead 2. The susceptor 3 holds the semiconductor substrate 5 thereon and heats or cools it with the temperature controller. The showerhead 2 is insulated from the reaction chamber 1 and connected to an outer high frequency power supply 4. Alternatively, the susceptor 3 can be connected to the power supply 4. Thus, the showerhead 2 and the susceptor 3 can each act as a high frequency electrode and generate a plasma-reacting field in proximity to the surface of the semiconductor substrate 5.

The gases can be mixed upstream of the gas inlet port 6 to constitute a process gas (e.g., a material gas for insulation film and an inert gas), or each or some of the gases can be introduced separately into the showerhead 2. A pre-deposition gas (e.g., CxHy precursor) also can be introduced into the showerhead 2 through the gas inlet port 6. The space between the showerhead 2 and the semiconductor substrate 5, both located inside of the reaction chamber 1 which is already evacuated, is charged with RF power which has a single frequency or mixed frequencies (e.g., 400 kHz to 60 MHz), and the space serves as a plasma field. The susceptor 3 continuously heats or cools the semiconductor substrate 5 with the temperature controller and maintains the substrate 5 at a predetermined temperature that is desirably −50° C.-50° C. The process gas supplied through the fine openings of the showerhead 2 remains in the plasma field in proximity to the surface of the semiconductor substrate 5 for a predetermined time.

When a patterned surface of a substrate is treated with a pre-deposition gas, the gas inside the reaction chamber is discharged through the exhaust port 8 and replaced with a material gas or a mixture of a material gas and an inert gas for depositing an insulation film on the treated patterned surface of the substrate.

The temperature of the susceptor 3 can be controlled by means of a heater and/or cooling conduits (now shown). This cooling susceptor may be made of ceramics and is provided with the cooling conduits at a lower portion of a metal plate and a shaft portion so that a cooling medium such as water can circulate.

A skilled artisan will appreciate that the apparatus includes one or more controller(s) (not shown) programmed or otherwise configured to cause the pre-deposition step and the deposition step described elsewhere herein to be conducted. The controller(s) are communicated with the various power sources, cooling/heating systems, pumps, robotics and gas flow controllers or valves of the reactor, as will be appreciated by the skilled artisan.

The embodiments will be explained with respect to preferred embodiments. However, the present invention is not limited to the preferred embodiments

EXAMPLES

A plasma CVD apparatus illustrated in FIG. 1 was used for the following examples. The temperature of a susceptor 3 was set at a given temperature, and then, a Si substrate 5 (φ300 mm) having patterned recesses (trenches) was loaded on the susceptor 3. Next, a gas was introduced into a reaction chamber 1 through a gas inlet port 6 and a showerhead 2. For a liquid material, it was vaporized by a vaporizer (not shown) upstream of the gas inlet port 6. The pressure inside the reaction chamber 1 was then controlled at a given pressure using a pressure control valve 9. RF power (13.56 MHz) from a generator 4 was applied at a given power between the showerhead 2 and the susceptor 3 which was grounded to generate a plasma using the gas and to expose the surface of the substrate 5 to the plasma for a give time period, thereby treating the surface of the substrate 5 with the plasma as a pre-deposition step, prior to the deposition step. Continuously, the deposition step using a material gas for a flowable insulation film began, using RF power, thereby filling the recesses formed on the surface of the substrate with the flowable insulation film. The flowable insulation film (Cabon-doped silicon oxide) was deposited on the patterned surface of the substrate by supplying 53 sccm (typically 16 sccm to 105 sccm) of diethoxymethylsilane, 250 sccm (typically 250 sccm to 500 sccm) of He, and 105 sccm (typically 5 sccm to 200 sccm) of $O_2$, and applying 100 W (typically 50 W to 300 W) of RF power at the same temperature as in the pre-deposition step under a pressure of 500 Pa (typically 200 Pa to 700 Pa) for 150 seconds. Thereafter, the filling ratio and flatness of the surface were determined using an SEM image of a cross section of the substrate.

Comparative Example 1

The pre-deposition step was conducted under the following conditions.

TABLE 1

| | |
|---|---|
| Substrate temperature | 20° C. |
| Pressure | 150 Pa |
| Gas used for pre-deposition step | He (300 sccm) |
| RF power | 100 W |
| Distance between electrodes | 9 mm |
| Duration | 60 seconds |

Figure 2:
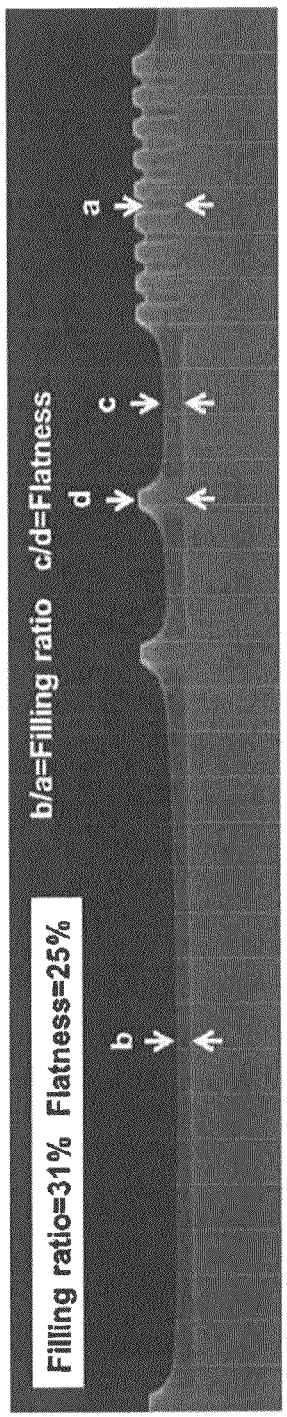
FIG. 2 is an SEM (scanning electron microscope) image showing a cross section of a substrate according to a comparative example.

The deposition step was continuously conducted after the pre-deposition step to deposit a low-k film. As a result, the recesses were filled with the low-k film as shown in FIG. 2, and the filling ratio and the flatness were measured. The filling ratio is defined as a ratio of b/a where as is a thickness of film deposited between side walls 100-nm apart from each other, and b is a thickness of film deposited between side walls 5-μm apart from each other. The flatness is defined as a ratio of c/d where c is a thickness of film deposited between side walls 1-μm apart from each other, and d is a height of recesses (310 nm). As can be seen from FIG. 2, when a He plasma was used for the pre-deposition step, although narrow recesses were almost fully filled, wide recesses were not filled (the filling ratio was measured as 31%), and intermediate recesses which represent flatness were also not significantly filled relative to the height of the recesses (the flatness was measured as 25%).

Comparative Example 2

The pre-deposition step was conducted under the following conditions:

TABLE 2

| Substrate temperature | 20° C. |
|---|---|
| Pressure | 150 Pa |
| Gas used for pre-deposition step | $H_2$ (300 sccm) |
| RF power | 100 W |
| Distance between electrodes | 9 mm |
| Duration | 60 seconds |

Figure 3:
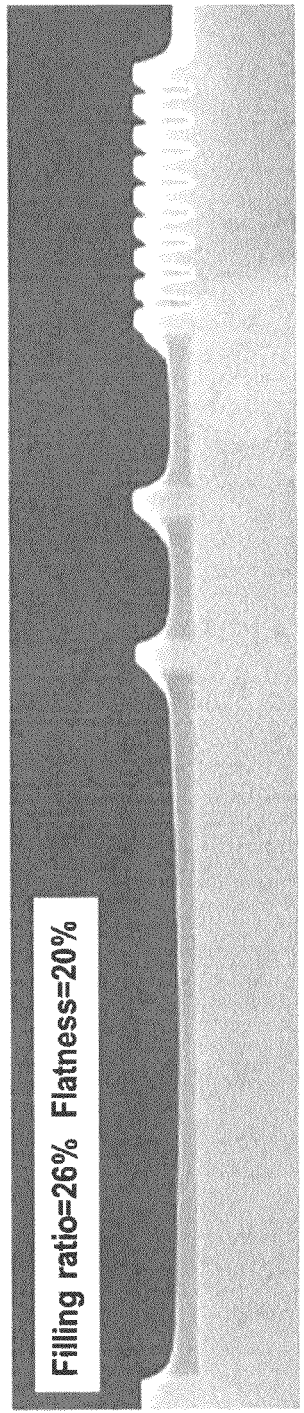
FIG. 3 is an SEM (scanning electron microscope) image showing a cross section of a substrate according to another comparative example.

The deposition step was continuously conducted after the pre-deposition step to deposit a low-k film. As a result, the recesses were filled with the low-k film as shown in FIG. 3, and the filling ratio and the flatness were measured. As can be seen from FIG. 3, when a $H_2$ plasma was used for the pre-deposition step, although narrow recesses were almost fully filled, wide recesses were not filled (the filling ratio was measured as 26%), and intermediate recesses which represent flatness were also not significantly filled relative to the height of the recesses (the flatness was measured as 20%).

Example 1

The pre-deposition step was conducted under the following conditions:

TABLE 3

| Substrate temperature | 20° C. |
|---|---|
| Pressure | 700 Pa |
| Gas used for pre-deposition step | hexane (234 sccm) |
| RF power | 200 W |
| Distance between electrodes | 9 mm |
| Duration | 60 seconds |

Figure 4:
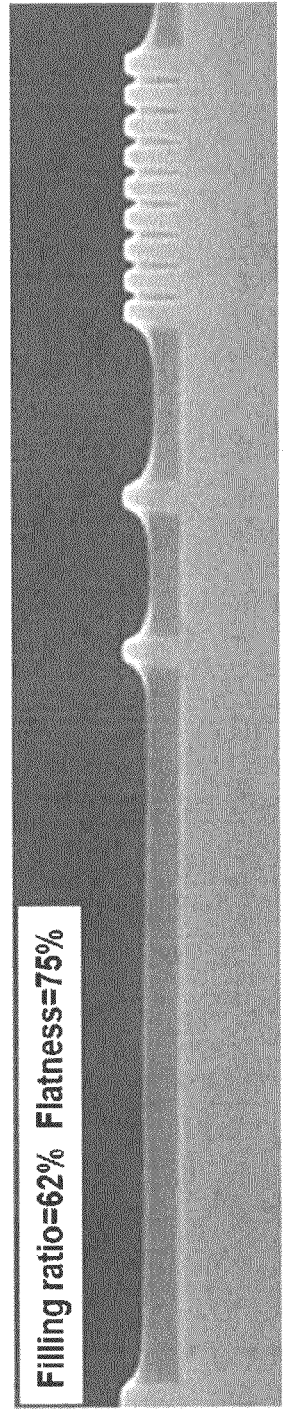
FIG. 4 is an SEM (scanning electron microscope) image showing a cross section of a substrate according to an embodiment of the present invention.

The deposition step was continuously conducted after the pre-deposition step to deposit a low-k film. As a result, the recesses were filled with the low-k film as shown in FIG. 4, and the filling ratio and the flatness were measured. As can be seen from FIG. 4, when a hexane plasma was used for the pre-deposition step, when narrow recesses were almost fully filled, wide recesses also were significantly filled (the filling ratio was measured as 62%), and intermediate recesses which represent flatness were also significantly filled relative to the height of the recesses (the flatness was measured as 75%).

Further, the dielectric constant of the insulation film was measured, and it was 2.83 which was equivalent to 2.80 which was the dielectric constant of the an insulation film deposited without the pre-deposition step, indicating that the pre-deposition step did not substantially affect the properties of the film.

Example 2

Figure 7:
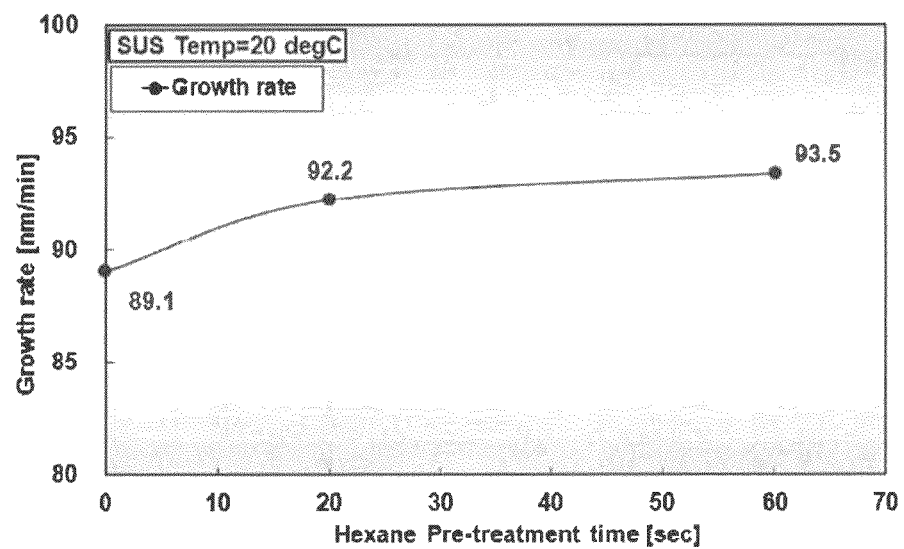
FIG. 7 is a graph showing the relationship between growth rate (nm/min.) of a flowable film and duration (sec.) of pre-deposition process using a hexane plasma according to an embodiment of the present invention.

Patterned recesses of a substrate were filled with a flowable insulation film under the conditions which were the same as in Example 1 except for the duration of the pre-deposition step. FIG. 7 is a graph showing the relationship between growth rate (nm/min.) of the flowable insulation film and the duration (sec.) of the pre-deposition step (using a hexane plasma). As can be seen from FIG. 7, the growth rate of the flowable insulation film was improved by about 5%.

Reference Example 1

Figure 5:
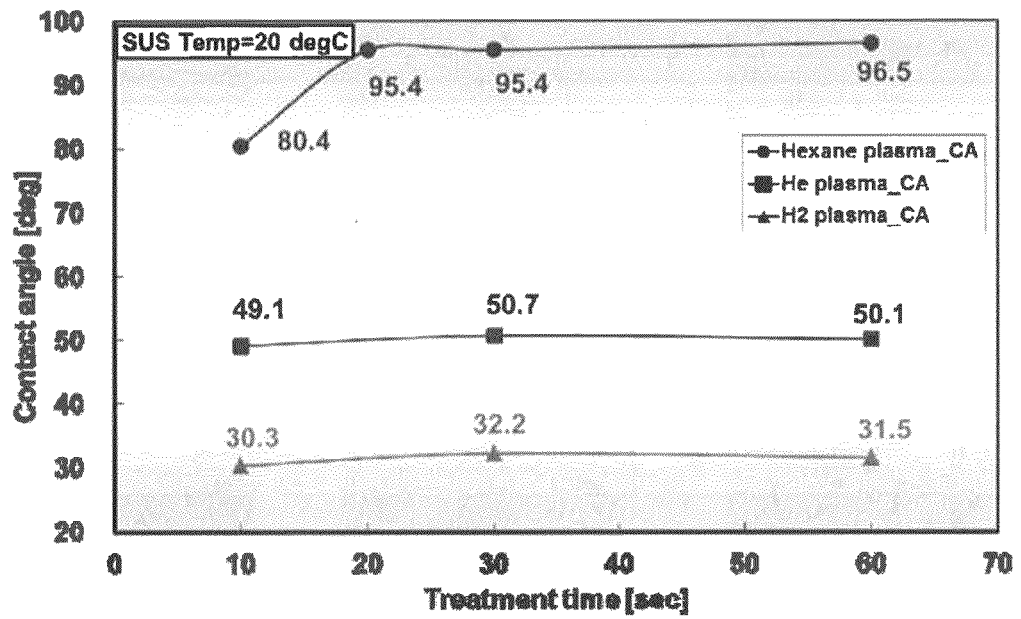
FIG. 5 is a graph showing the relationship between contact angle (°) of a Si substrate and duration (sec.) of pre-deposition process using different plasmas.

A Si substrate was exposed to a given plasma for a given time period in the reaction chamber under the conditions for the pre-deposition step described in Comparative Examples 1 and 2 and Example 1 above. The water contact angle of the exposed surface was measured. FIG. 5 is a graph showing the relationship between contact angle (°) of the Si substrate and the duration (sec.) of pre-deposition step.

As can be seen from FIG. 5, by exposing the surface to a hexane plasma, the contact angle of the surface was drastically increased, i.e., the surface became highly hydrophobic, even 10 seconds after the exposure (the contact angle was 80.4°). The contact angle of the surface was further increased by continuing exposure for another 10 seconds (a total of 20 seconds), reaching a contact angle of 95.4°. In contrast, the contact angle of the surface exposed to a He plasma or $H_2$ plasma was not significantly increased even when extending exposure.

Reference Example 2

Figure 6:
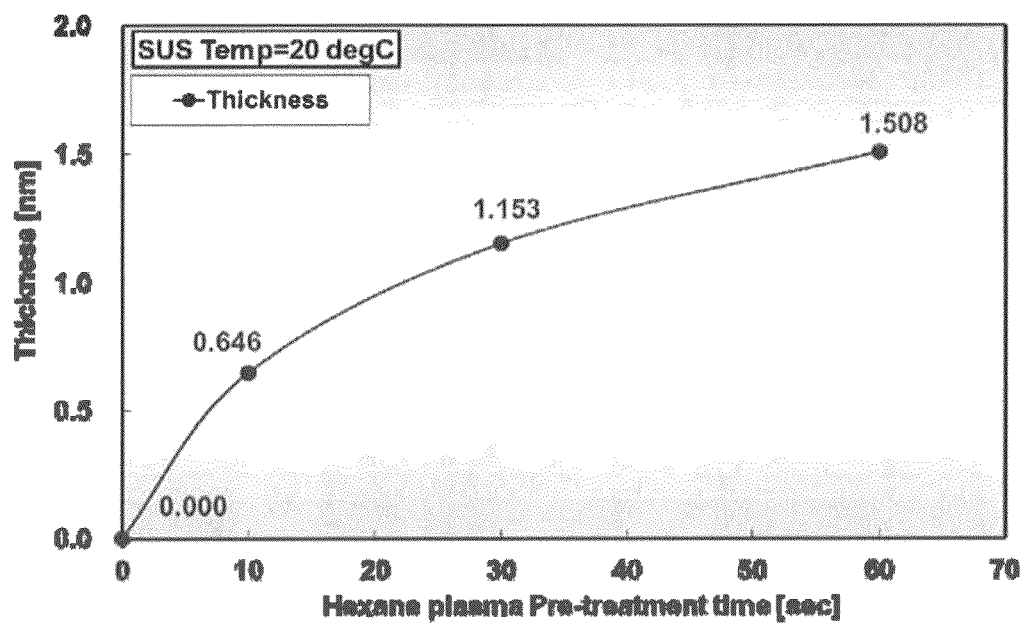
FIG. 6 is a graph showing the relationship between thickness (nm) of a pre-deposition coating and duration (sec.) of pre-deposition process using a hexane plasma according to an embodiment of the present invention.

A Si substrate was exposed to a hexane plasma for a given time period in the reaction chamber under the conditions for the pre-deposition step described in Example 1 above. The thickness of a resultant pre-deposition coating was measured. FIG. 6 is a graph showing the relationship between thickness (nm) of the pre-deposition coating and the duration (sec.) of the pre-deposition step.

As can be seen from FIG. 6, the thickness of the pre-deposition coating increased with time, and reached 1.51 nm when the pre-deposition step was conducted for 60 seconds. However, as shown in FIG. 5, the contact angle reached 95.4° when the pre-deposition step was conducted for 20 seconds, and thus, a pre-deposition coating having a thickness of about 1.0 nm is expected to be sufficient to render the surface effectively hydrophobic to improve flatness of the patterned surface of the substrate.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for filling recesses of a substrate with an insulation film, comprising:
   (i) exposing surfaces of the recesses of the substrate to a pre-deposition gas in a reactive state in a reaction space to treat the surfaces with reactive hydrocarbons generated from the pre-deposition gas without filling the recesses, said pre-deposition gas being a hydrocarbon consisting of C and H but exclusive of methane, ethane, propane, ethylene, acetylene, and hexamethyldisilazane, said pre-deposition gas being excited by applying RF power to the reaction space under a pressure of about 100 Pa to about 1,200 Pa, whereby the surface of the recesses is rendered hydrophobic, having a water contact angle of more than 80° but less than 100°; and (ii) depositing a flowable insulation film using a process gas other than the pre-deposition gas on a surface of the substrate to fill the recesses treated in step (i) therewith by plasma reaction.

2. The method according to claim 1, wherein step (i) continues until a film having a thickness of less than about 1.5 nm is formed on the surfaces, and thereafter is stopped.

3. The method according to claim 1, wherein the pre-deposition gas contains a saturated hydrocarbon.

4. The method according to claim 1, wherein during step (i), no oxidizing gas or halide gas is introduced to the reaction space.

5. The method according to claim 1, wherein all the gas used in step (i) consists of the pre-deposition gas alone or a mixture of the pre-deposition gas and an inert gas.

6. The method according to claim 1, wherein in step (i), the pre-deposition gas is excited by applying RF power to the reaction space to which the pre-deposition gas is introduced.

7. The method according to claim 6, wherein the RF power is applied at a power of 0.35 W/cm$^2$ or less per area of the substrate.

8. The method according to claim 1, wherein step (i) is conducted for a period of no less than about 30 seconds but no more than 300 seconds.

9. The method according to claim 1, wherein step (ii) is conducted at a temperature of 50° C. or lower as the temperature of the substrate.

10. The method according to claim 1, wherein steps (i) and (ii) are conducted continuously.

11. The method according to claim 1, wherein the surfaces of the recesses prior to step (i) are hydrophilic.

12. The method according to claim 11, wherein the surfaces of the recesses are constituted by silicon, GaAS, or quartz glass.

13. The method according to claim 11, wherein the surfaces are further constituted by a wiring material.

14. The method according to claim 1, wherein the flowable insulation film is a low-k film.

15. The method according to claim 1, wherein the flowable film is constituted by silicon oxide.

16. The method according to claim 1, wherein step (ii) is conducted by plasma-enhanced CVD.

17. The method according to claim 1, wherein the pre-deposition gas excludes a silazane compound.

* * * * *